(12) United States Patent
Syage et al.

(10) Patent No.: US 6,737,642 B2
(45) Date of Patent: May 18, 2004

(54) HIGH DYNAMIC RANGE ANALOG-TO-DIGITAL CONVERTER

(75) Inventors: Jack A. Syage, Huntington Beach, CA (US); Mark A. Hanning-Lee, Tustin, CA (US)

(73) Assignee: Syagen Technology, Tustin, CA (US)

( * ) Notice: Subject to any disclaimer, the term of this patent is extended or adjusted under 35 U.S.C. 154(b) by 0 days.

(21) Appl. No.: 10/101,670

(22) Filed: Mar. 18, 2002

(65) Prior Publication Data

US 2003/0173514 A1 Sep. 18, 2003

(51) Int. Cl.$^7$ .......................... H01J 49/40; B01D 59/44
(52) U.S. Cl. ...................... 250/287; 250/281; 250/283; 250/286; 250/397
(58) Field of Search ................................ 250/287, 281, 250/283, 286, 397

(56) References Cited

U.S. PATENT DOCUMENTS

| | | |
|---|---|---|
| 3,555,272 A | 1/1971 | Munson et al. |
| 4,365,157 A | 12/1982 | Unsold et al. |
| 4,540,884 A | 9/1985 | Stafford et al. |
| 4,733,073 A | 3/1988 | Becker et al. |
| 4,780,608 A | 10/1988 | Cross et al. |
| 4,849,628 A | 7/1989 | McLuckey et al. |
| 4,855,594 A | 8/1989 | Kimock et al. |
| 4,861,988 A | 8/1989 | Henion et al. |
| 4,876,502 A | 10/1989 | Verbanets et al. |
| 4,931,640 A | 6/1990 | Marshall et al. |
| 5,032,721 A | 7/1991 | Bacon et al. |
| 5,068,658 A | 11/1991 | Ohlsson et al. |
| 5,070,240 A | 12/1991 | Lee et al. |
| 5,138,552 A | 8/1992 | Weedon et al. |
| 5,153,672 A | 10/1992 | Globig et al. |
| 5,198,816 A | 3/1993 | Kalinowski et al. |
| 5,206,594 A | 4/1993 | Zipf |
| 5,234,838 A | 8/1993 | Bacon, Jr. |
| 5,248,973 A | 9/1993 | Babu et al. |
| 5,283,436 A | 2/1994 | Wang |
| 5,289,529 A | 2/1994 | Karnowski |
| 5,294,797 A | 3/1994 | Frey et al. |
| 5,311,016 A | 5/1994 | Villa-Aleman |
| 5,338,931 A | 8/1994 | Spangler et al. |
| 5,343,488 A | 8/1994 | Guyot et al. |

(List continued on next page.)

OTHER PUBLICATIONS

Mahon, et al, "Third–Harmonic Generation in Argon, Krypton, and Xenon: Bandwidth Limitations in the Vicinity of Lyman–a", IEEE Journal of Quantum Electronics, vol. QE–15, No. 6, Jun. 1979, pp 444–451.

Rettner, et al, "Pulsed Free Jets: Novel Nonlinear Media for Generation of Vaccum Ultraviolet and Extreme Ultraviolent Radiation", The Journal of Physical Chemistry, Vol 88, No. 20, 1984, pp 4459–4465.

Tonkyn, et al, "Compact Vacuum Ultraviolet Source for Photoelectron Spectroscopy", Rev. Sci. Instrum. vol. 60, No. 7, Jul. 1989, pp 1245–1251.

(List continued on next page.)

Primary Examiner—Nikita Wells
(74) Attorney, Agent, or Firm—Irell & Manella LLP

(57) ABSTRACT

A high speed analog to digital converter ("ADC") that can be used in a detector system. The ADC is coupled to a detector and a processor. The detector generates an analog signal in response to the detection of a trace sample, such as an ionized molecule or a beam of light. The processor determines a baseline value and threshold value. Portions of the analog signal at or below the threshold are assigned the baseline value. The threshold typically corresponds to a value above the noise level in the system. The detector thus removes undesirable noise from the readout value. The process can compensate for factors such as DC drift while providing accurate data regarding detection of the trace sample.

20 Claims, 8 Drawing Sheets

U.S. PATENT DOCUMENTS

| | | | |
|---|---|---|---|
| 5,381,006 A | 1/1995 | Wells et al. |
| 5,393,979 A | 2/1995 | Hsi |
| 5,397,895 A | 3/1995 | Leone et al. |
| 5,412,207 A | 5/1995 | Micco et al. |
| 5,422,575 A | 6/1995 | Ferrer et al. |
| 5,422,643 A | 6/1995 | Chu et al. |
| 5,469,323 A | 11/1995 | Kanayama |
| 5,504,328 A | 4/1996 | Bonser |
| 5,527,731 A | 6/1996 | Yamamoto et al. |
| 5,554,846 A | 9/1996 | Regiec et al. |
| 5,568,144 A | 10/1996 | Chiao et al. |
| 5,569,917 A | 10/1996 | Buttrill, Jr. et al. |
| 5,630,221 A | 5/1997 | Birleson |
| 5,631,462 A | 5/1997 | Reents, Jr. |
| 5,712,480 A | * 1/1998 | Mason | 250/287 |
| 5,777,326 A | * 7/1998 | Rockwood et al. | 250/287 |
| 5,808,299 A | 9/1998 | Syage |
| 5,826,214 A | 10/1998 | Lieb et al. |
| 5,854,431 A | 12/1998 | Linker et al. |
| 5,869,832 A | 2/1999 | Wang et al. |
| 5,906,946 A | 5/1999 | Sausa et al. |
| 5,981,946 A | * 11/1999 | Mason | 250/287 |
| 6,011,259 A | 1/2000 | Whitehouse et al. |
| 6,028,543 A | 2/2000 | Gedcke et al. |
| 6,040,575 A | 3/2000 | Whitehouse et al. |
| 6,140,638 A | 10/2000 | Tanner et al. |

OTHER PUBLICATIONS

R. Wallenstein, "Generation of Narrowband Tunable VUV Radiation at the Lyman–a Wavelength", Optics Communications, vol. 33, No. 1, Apr. 1980, pp 119–122.

R. Hilbig, et al, "Tunable VUV Radiation Generated by Two–Photon Resonant Frequency Mixing in Xenon", IEEE Journal of Quantum Electronics, vol. QE–19, No. 2, Feb. 1983, pp 194–201.

Jack A. Syage, "Real–Time Detection of Chemical Agents Using Molecular Beam Laser Mass Spectrometry", American Chemical Society, 1990.

David M. Lubman, "Lasers and Mass Spectrometry", Oxford University Press, 1990, pp 469–489.

Nesselrodt, et al., Cyclic Ketone Mixture Analysis Using 2+1 Resonance–Enhanced Multiphoton Ionization Mass Spectrometry.

R. Frey, et al. "Real–Time Vehicle Exhaust Analysis Using a Laser TOF Mass Spectrometer" Proc. $40t^h$ Anal. Conf. Mass Spectrom & Allied Topics, 1992, pp 678–679.

R. Tembreull, et al. Pulsed Laser Desorption of Biological Molecules in Supersonic Beam Mass Spectrometry with Resonant Two–Photon Ionization Detection.

Steven M. Michael, "An Ion Trap Storage/Time–of–Flight Mass Spectrometer", pp. 4277–4284.

Mark G. Qian et al, A Hybrid Instrument That Combines TOF With The Ion Trap Yields Excellent Sensitivity For Small Samples.

E.R. Rohwer, R.C. Beavis, C. Koster, J. Lindner, J. Grotemeyer and E.W. Schlag, "Fast Pulsed Laser Induced Electron Generation for Electron Impact Mass Spectrometry", Nov. 23, 1988, pp. 1151–1153.

J.G. Boyle, L.D. Pfefferle, E.E. Gulcicek, S.D. Colson, "Laser–driven Electron Ionization for a VUV Photoionization Time–Of–Flight Mass Spectrometer", (11) pages; American Institute of Physics.

P.Y. Cheng and H.L. Dai, "A Photoemitted Electron–Impact Ionization Method For Time–Of–Flight Mass Spectrometers", pp. 2211–2214, American Institute of Physics.

U. Boesl et al. "Laser Ion Sources For Time–Of–Flight Mass Spectrometry", Int. J. Mass Spectrom. Ion Processes 131 (1994) 87–124.

* cited by examiner

HIGH DYNAMIC RANGE ANALOG-TO-DIGITAL CONVERTER

BACKGROUND OF THE INVENTION

1. Field of the Invention

The subject matter disclosed generally relates to high speed analog to digital converters used for detectors such as mass spectrometers and light ranging detectors.

2. Background Information

There is a critical need to develop electronic detection systems capable of recording high-speed transient events. High speed transient detectors typically utilize digitization techniques to process the data. One of the major challenges in high-speed digitization is maximizing the dynamic range of detection, which is generally defined as the measurable range spanning the limit of weak to strong signal. Assuming low analog noise, the minimum signal level detectable by a transient digitizer is generally on the order of one ion or photon per time bin per trigger event. Transient digitizers are considered to operate in what is called the strong signal limit, usually defined as a detected flux of ions or photons corresponding to multiple events per time resolution element (or time bin). Weaker signals are generally masked by the analog noise arising from the detector, amplifier, and digitizer of the detector.

The weak signal regime is defined as the detection of less than one ion or photon count per bin per trigger event. In this regime, it is necessary to use pulse detection for individual ion or photon counts, where each pulse is timed and deposited as a bit in a time bin measured by a multichannel scaler (MCS). To achieve high-speed operation, pulses are detected as binary events, returning either a 0 or 1. This leads to the potential for counting error when multiple pulses are detected as one pulse. To keep the probability of multiple pulses per time bin per trigger event to an acceptable level, the maximum counting probability per time bin is typically limited to about 0.1.

High dynamic range detectors often use both transient digitizer and MCS/averager systems. However, this method has several drawbacks: (1) such a system is expensive and complicated, (2) it requires routines to recognize whether a signal is in the strong or weak limit, (3) it must seam the data together from the two detection systems, and (4) the signal regime between 0.1 and 1 count per trigger event per bin is inadequately measured by either method.

Another detection method employs a threshold condition for a digitizer (threshold digitizer). However, the routine does not keep track of the baseline value and hence intensity errors can occur as shown in FIG. 1. For example, a DC drift in the signal may raise portions of the noise above the threshold and produce errant signals. Another method is also based on a transient digitizer and achieves noise elimination by offsetting the signal so that the analog noise appears below the minimum scale (offsetting digitizer). The minimum scale then defines the threshold for signal and the minimum value. Again, the true baseline is not recorded and intensity errors can result as illustrated in FIG. 1.

U.S. Pat. No. 5,568,144 issued to Chiao et al. discloses a method to extend the dynamic range for recording waveforms. The method uses a threshold to distinguish a weak signal from a strong signal. The waveform is directly measured for the weak signal and the strong signal is measured using a differential process. This method is more suitable for repetitive waveform analysis. It is not applicable to the case where the weak signals are individual ion or photon counts and where each transient response is different.

U.S. Pat. No. 5,138,552 issued to Weedon et al. discloses a data acquisition system that uses non-linear digitization intervals to expand dynamic range. Again, this method is for waveforms and not single counts. U.S. Pat. No. 5,422,643 issued to Chu et al. discloses a high dynamic range digitizer that is based on a plurality of channels. The channels receive a signal that is passed through a scaling bank to partition the high dynamic range into a number of vertical intensities. Another disclosure based on a multichannel approach is in U.S. Pat. No. 5,068,658 issued to Ohlsson et al. Other multichannel approaches including variable gain have also been disclosed in the patent literature. The latter methods all are based on multiple channels of detection. Multi-channel detectors are relatively expensive to produce.

Other methods have been developed for extending the dynamic range of a detector. U.S. Pat. No. 6,028,543 issued to Gedcke et al. discloses a method based on dithering successive ADC traces by a varying value that is less than the least significant bit. For example, 4 bits of additional resolution may be obtained by dithering the baseline in intervals of 1/16 of the least significant bit. However, this method requires at least 16 scans to achieve the resolution enhancement, and is most effective for repetitive signals.

Dynamic range may also be extended by increasing the number of detector segments that can detect a signal. This method enables multiple counts to be detected simultaneously. A disadvantage to this method is that each segment requires its own data system, which makes the overall system complex and expensive to produce. For photon detection, a multicathode photomultiplier tube (PMT) detector allows multiple pulses to be detected at once, on the premise that they are likely to strike different regions of the detector face and hence lead to independent pulses on separate anodes. In theory, the PMT can be divided into more segments to further increase dynamic range.

BRIEF SUMMARY OF THE INVENTION

A detector system that includes a detector, an analog to digital converter and a processor. The detector provides an analog signal. The analog signal is processed to determine a baseline value and threshold value, wherein portions of the signal below or at the threshold are assigned the baseline value.

DETAILED DESCRIPTION

Disclosed is a high speed analog to digital converter ("ADC") that can be used in a detector system. The ADC is coupled to a detector and a processor. The detector generates an analog signal in response to the detection of a trace sample, such as an ionized molecule or a beam of light. The processor determines a baseline value and threshold value. Portions of the analog signal at or below the threshold are assigned the baseline value. The threshold typically corresponds to a value above the noise level in the system. The detector thus removes undesirable noise from the readout value. The process can compensate for factors such as DC drift while providing accurate data regarding detection of the trace sample.

Figure 1:
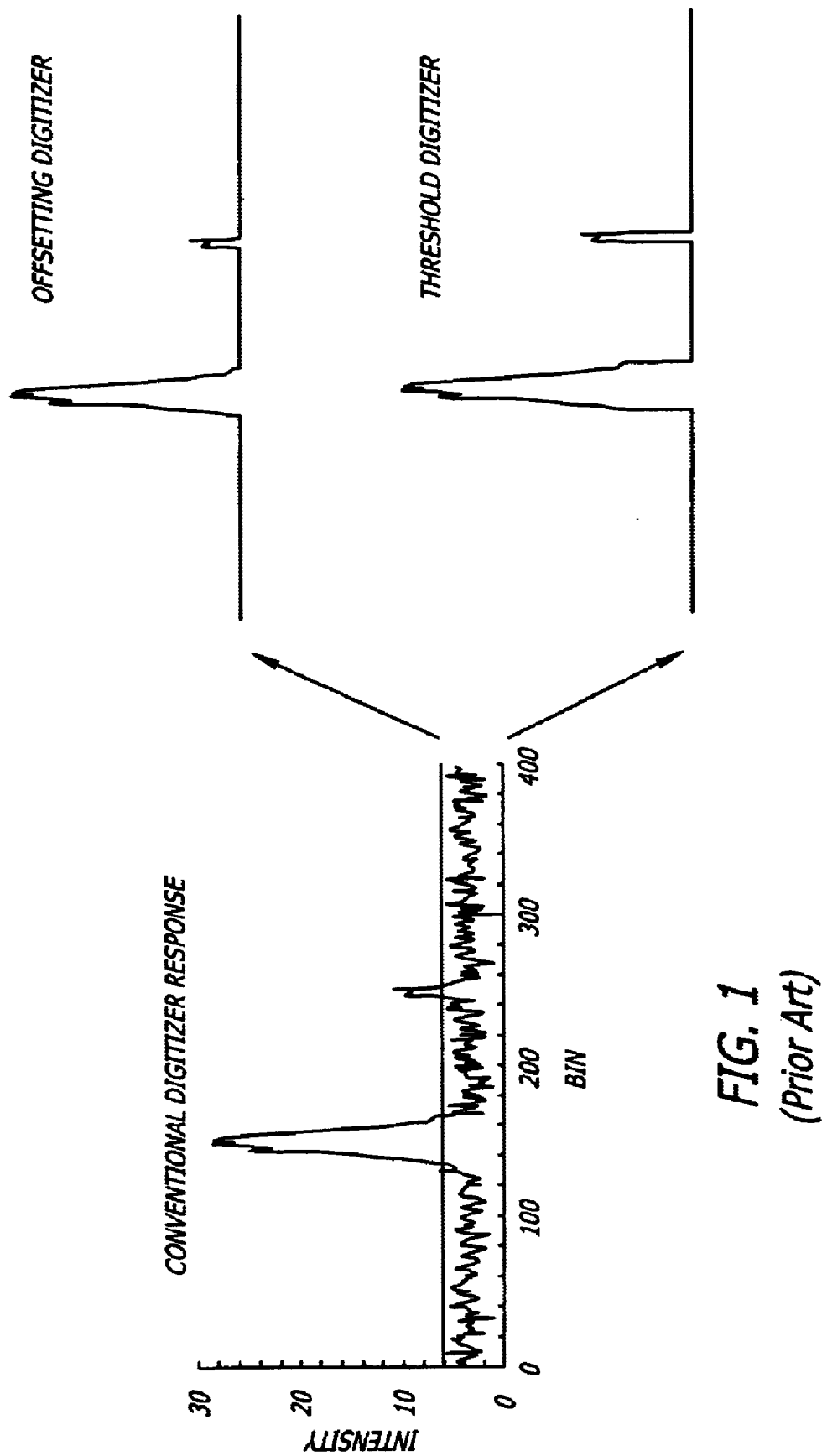
FIG. 1 are graphs showing the output signals with detectors of the prior art.
Figure 2:
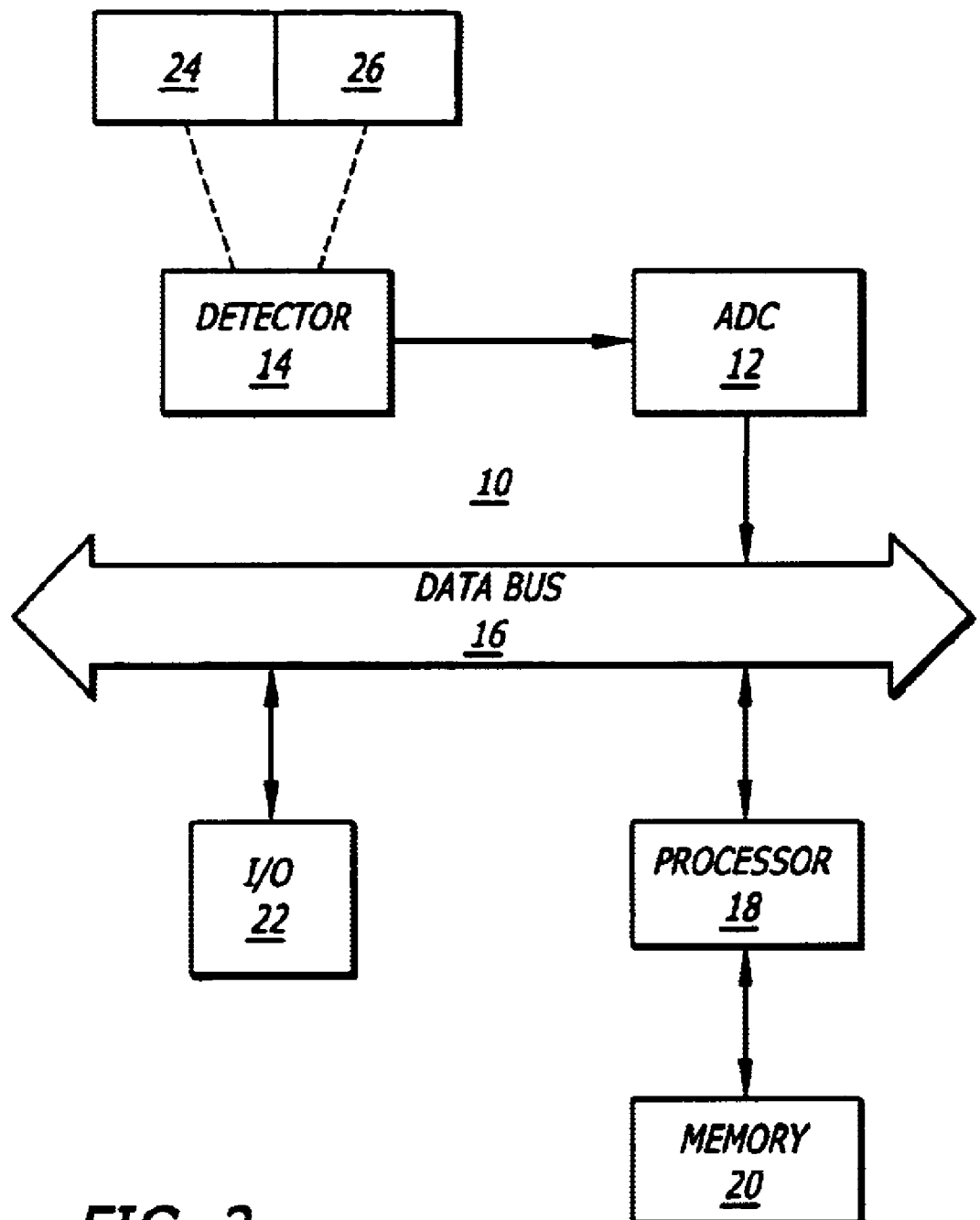
FIG. 2 is a schematic of a detector.

Referring to the drawings more particularly by reference numbers, FIG. 2 shows a detector system 10. The system 10 includes an analog to digital converter ("ADC") 12 connected to a detector 14. The detector 14 provides an analog signal in response to the detection of a trace sample. By way of example, the detector 14 may be an anode that detects ionized trace samples. Alternatively, the detector 14 may be a photodetector that detects light. The ADC may be an 8 bit digitizer.

The ADC 12 is connected to a data bus 16. Also connected to the data bus 16 is a processor 18 which may be connected to memory 20. The system 10 may further include an input/output (I/O) device(s) 22 such as a monitor and/or a printer. The ADC 12 may be physically located on a board that is connected to a PCI bus. The processor may be connected to a motherboard of a computer. Alternatively, to improve processing speed it is desirable to locate the ADC 12 and processor 18 on the same printed circuit board.

The system 10 may be integrated into a time of flight mass spectrometer TOFMS that has a mass ionizer/accelerator 24. The ionizer/accelerator 24 ionizes a sample and then accelerates the ionized particles from the sample toward the detector 14. Alternatively, the system 10 may be integrated into light detection and ranging (LIDAR) system. The LIDAR system contains a light source 26 that emits a light beam that is detected by the detector 14.

TOFMS and LIDAR systems require high speed data acquisition capable of capturing single-shot fast transient events with a resolution as low as 1 nanosecond, with high resolution of at least 8 bits, and a high repetition rate of 10–1000 Hertz.

Figure 3:
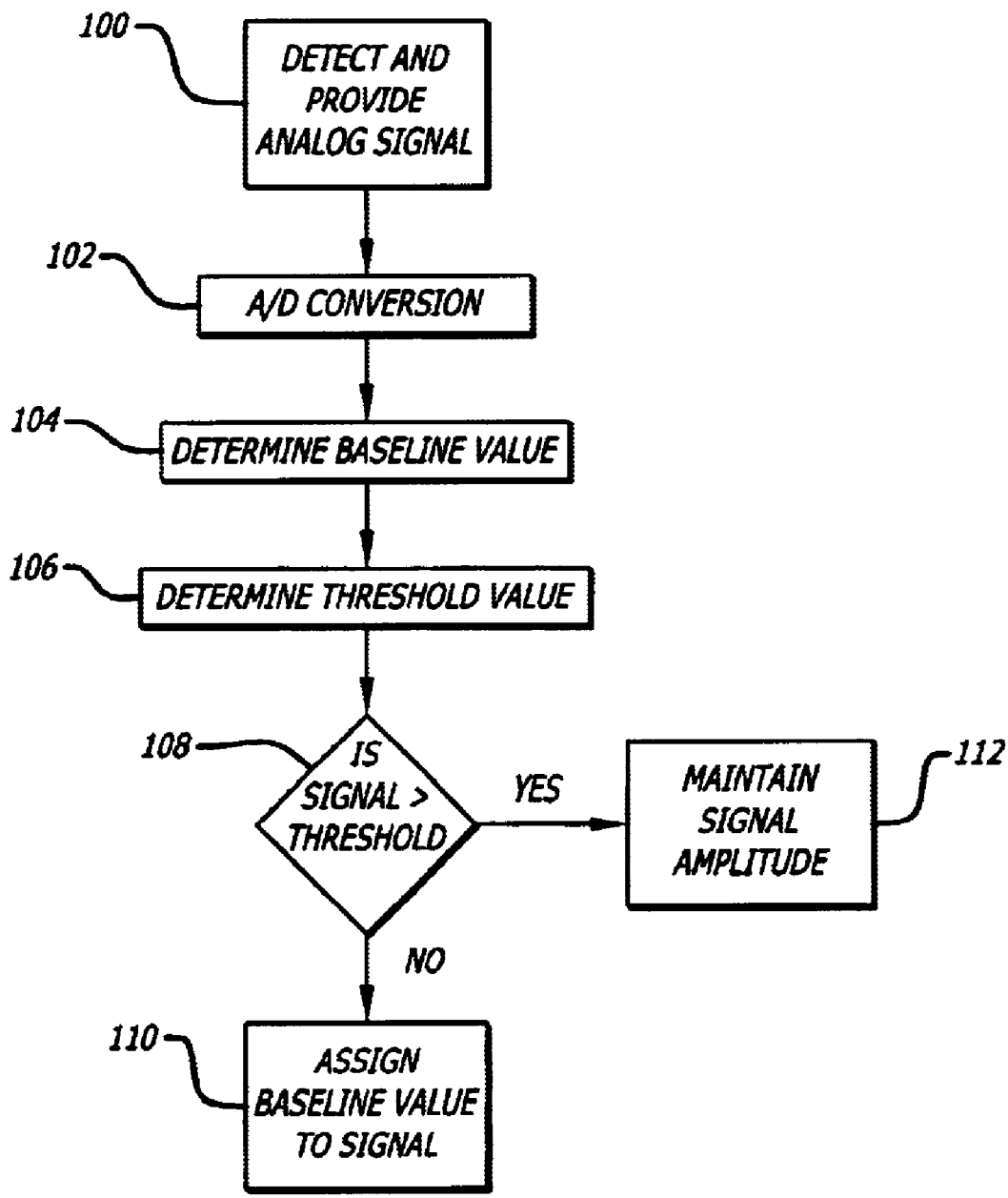
FIG. 3 is a flowchart of a detection process.

FIG. 3 is a flowchart of a process performed by the system 10. In block 100, the detector will detect one or more pulses of the trace sample and provide an output signal with an analog waveform. The ADC converts the analog signal in block 102 to a bit string that has a plurality of bits.

The processor then determines a baseline value in block 104. The threshold is used to cancel out noise in the transient signal. The baseline value can be determined by a number of different techniques. By way of example, the baseline can be determined by computing an average noise distribution. Alternatively, the baseline may be a linear ramp value computed by averaging a few data points at the beginning and end of the transient signal. The baseline could be computed with a polynomial or other function. The baseline could also be established by filtering low frequency aberrations in the signal. By way of example, the baseline may be set to zero.

Figure 4:
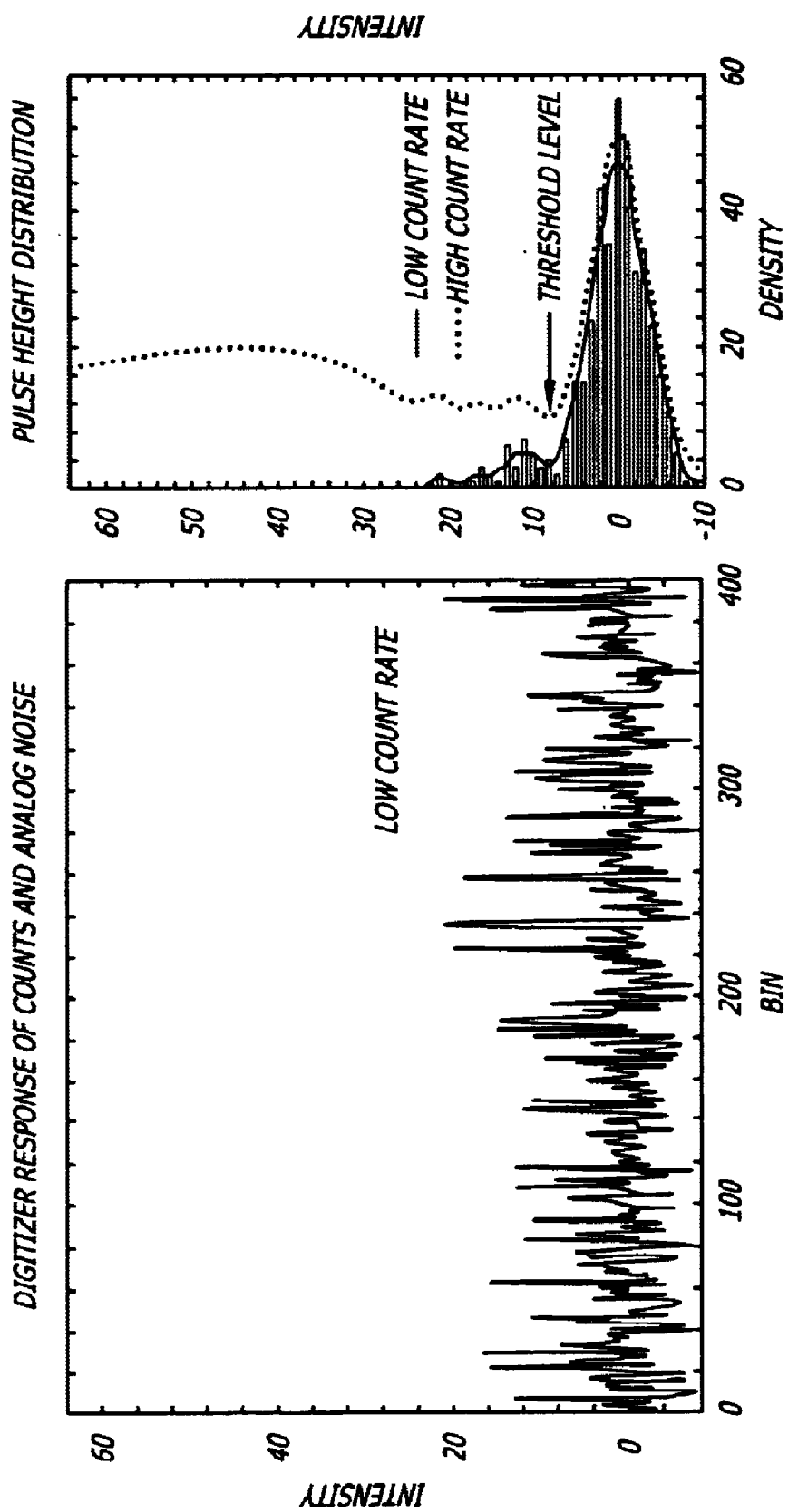
FIG. 4 are graphs showing a histogram of transient signals.

The processor determines a threshold value in block 106. As shown in FIG. 4, the threshold can be determined from a histogram of transient signals. The histogram can be constructed by binning the analog intensities into bands (e.g. 0.5–1.5, 1.5–2.5, etc.). The threshold can be selected as the point between two peaks. The threshold is typically larger than the intensity value at that point to insure that all noise is cancelled from the signal. The threshold value may be determined per each trigger event or it may be determined once for an entire set of trigger events. The threshold value may also be redetermined more than once within a single transient signal.

In decision block 108 at each computation step the amplitude of the transient signal is compared with the threshold value. If the amplitude is greater than the threshold then that portion of the signal is given the signal amplitude in block 110. If the amplitude is the same or less than the threshold then that portion of the signal is given the baseline value in block 112. The result is a waveform that provides true intensity values without noise. By computing the baseline value from the transient signal this process accounts for variations in the baseline signal such as DC drift.

The detector may detect a number of pulses in the same time bin. It may be desirable to count the individual pulses produced by the trace sample. The number of pulses can be computed by dividing a peak amplitude by a mean pulse intensity. The mean pulse intensity can be computed from a histogram of transient signals.

There are a number of techniques that can be used to improve the processing speed of the system 10. For example, a plurality of transient signals can be summed before performing the steps 102–112. Summing spectra would reduce the number of data that must be processed. The number of transient signal spectra that can be summed may be limited by the single-shot pulse intensity to noise ratio. Data processing may be improved by compressing the data such as be reducing the sampling rate of the ADC.

Figure 5:
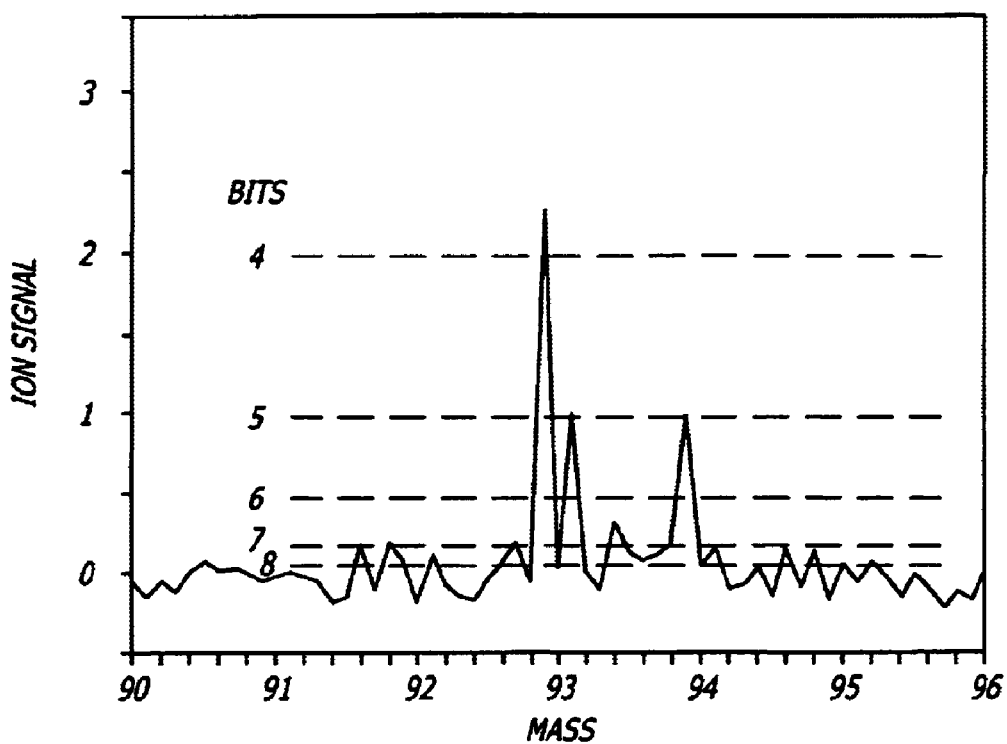
FIG. 5 is a graph showing a correlation between an analog signal and the bit levels of an analog to digital converter.

The data processing speed may also be improved by setting the ADC 12 to cancel the noise. This can be done by setting one or more output bits of the ADC to zero. For example, referring to FIG. 5, the amplitude of the transient signal can be defined by bits 1–8 of the ADC. The least significant bits (LSBs) 6, 7 and 8 can be set to zero by the processor so that any signal at or below the level corresponding to the $6^{th}$ bit will result in an ADC output of all zeros. The processor therefore does not have to process signal amplitudes at or below the threshold.

Another way to improve processing speed would be to operate the ADC at a more coarse vertical resolution. This could be done by lowering the ADC resolution, decreasing the gain of the signal from the detector so that noise occurs below the LSB or switching the range of the ADC so that the LSB is above the noise. This can all be done under processor control.

Figure 6:
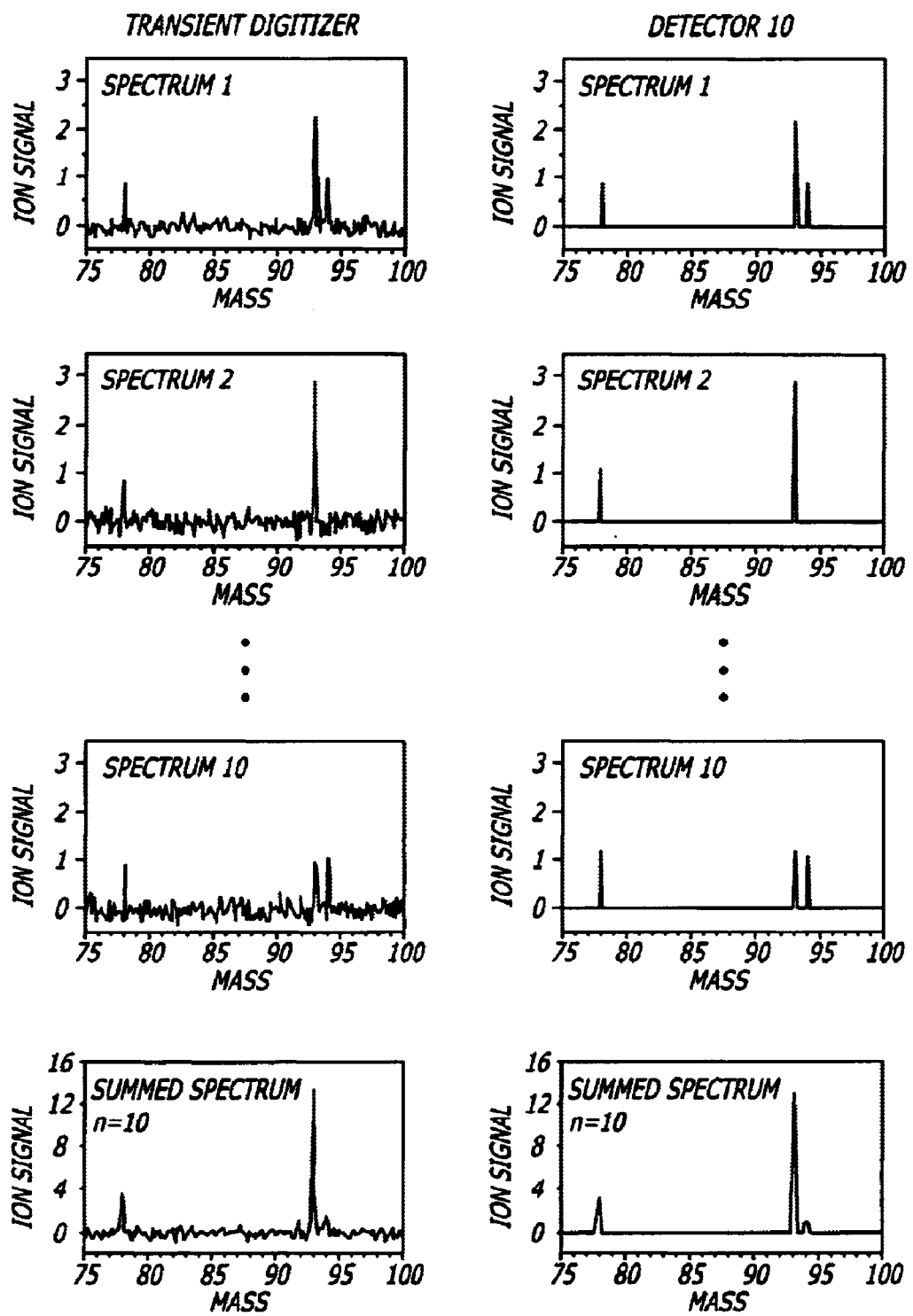
FIG. 6 are graphs comparing the output of the detector with a prior art detector.

FIG. 6 shows the advantageous results produced by the system 10 over a conventional, transient digitizer of the prior art. By compensating for variations in the baseline of the transient signal, the system can provide more accurate signal levels than pre-existing systems. The process effectively eliminates noise so that both weak and strong signals can be detected by the system 10. Table I provides a side by side comparison of the different systems, where I is the intensity level and T is a threshold.

TABLE I

| Logic condition | Conventional digitizer | Conventional MCS | Detector 10 | Threshold digitizer | Off-setting digitizer |
|---|---|---|---|---|---|
| I ≧ T | I | 1 | I | I | I |
| I < T | Noise level | 0 | B | 0 | T |

B = baseline

Figure 7:
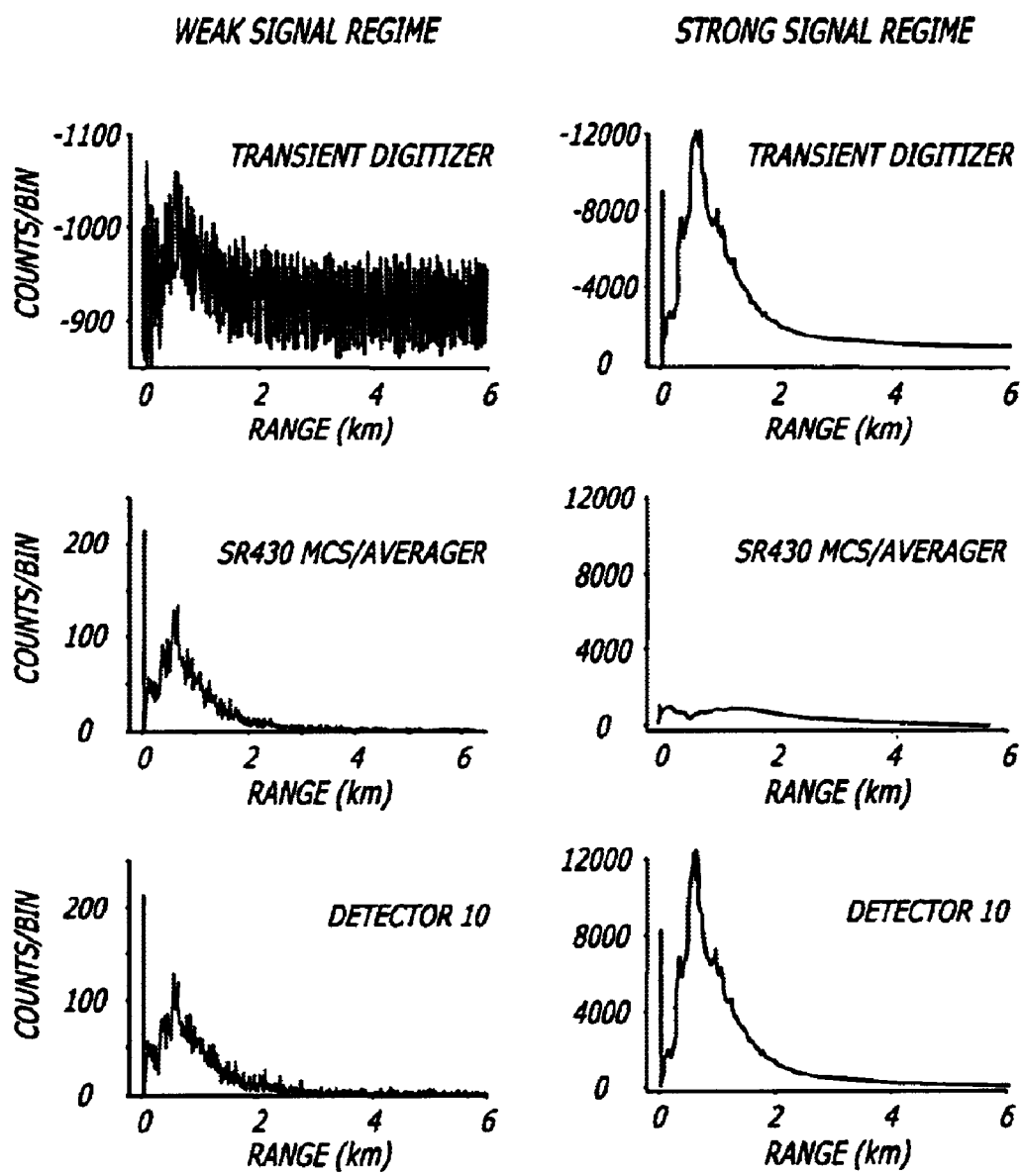
FIG. 7 are graphs comparing the detector with LIDAR detectors of the prior art.

FIG. 7 compares the detector 10 to conventional methods based on a transient digitizer and a MCS/averager for a weak and strong LIDAR signal. In the weak signal regime, the transient digitizer analog noise overwhelms the weak photon count signal. The MCS/averager correctly measures the return signal. The detector 10 gives essentially an identical response to the MCS/averager. In the strong signal regime, the transient digitizer correctly measures the return signal (except for the long range DC offset). The MCS/averager saturates severely in this regime. The detector 10 gives essentially the same response as the transient digitizer and takes out the baseline distortion that led to the DC offset at long range for the transient digitizer. Table II summarizes the benefits of the detector 10.

TABLE II

| | Weak Signal | Strong Signal |
|---|---|---|
| Detector 10 | Correct | Correct |
| Transient Digitizer | Noisy signal | Correct |
| Multichannel scaler/averager | Correct | Saturated signal |

Figure 8:
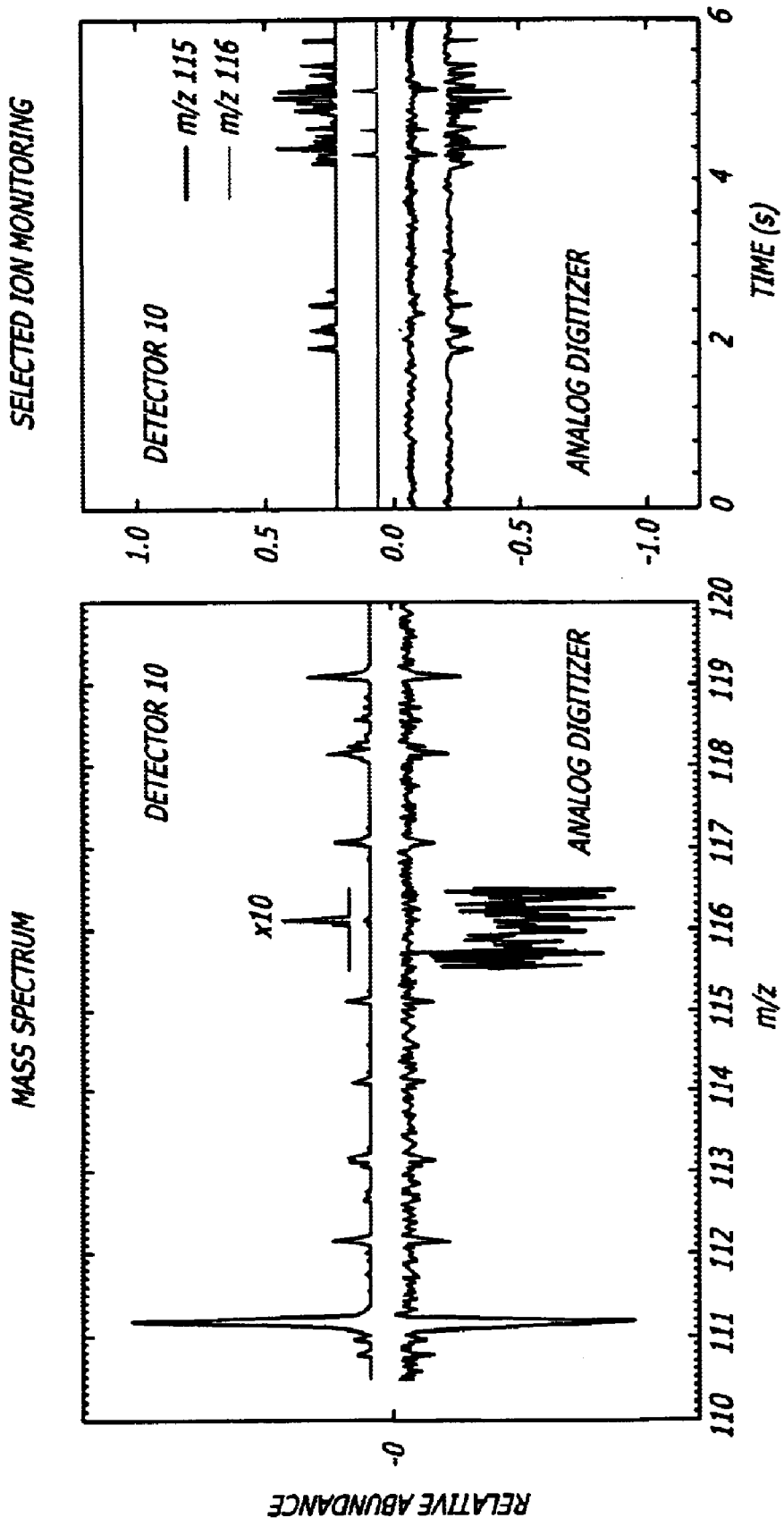
FIG. 8 are graphs comparing the detector with TOFMS detectors of the prior art.

FIG. 8 compares the detector 10 to conventional methods for TOFMS. The spectrum on the left hand side shows the detector 10 response (presented as positive going signal) and the transient digitizer response (negative going signal). The detector effectively eliminates analog noise. This enables very weak signals to be observed that would otherwise be obscured by noise. This is very evident for the signal at m/z 116. On the right hand side of FIG. 8 are time responses for the signal at m/z 115 and 116. For the m/z 116 signal, there are three evident ion pulses detected. The detector 10 monitored response shows that the three pulses can be detected while eliminating the noise. This allows the summed response to show the three-count signal without accumulating the analog noise that obscures the signal on the left hand spectrum.

The dynamic range for a single time bin after an accumulation of n scans can be summarized by the following for the detector 10 vs. the transient digitizer vs. the MCS/averager:

$DR(n)=n \times DR(1)$ for detector 10 and MCS/averager $DR(n)=n^{1/2} \times DR(1)$ for transient digitizer DR(1) is the dynamic range for a single scan and is defined as the maximum number of counts per time bin that can be detected for a single scan. For an MCS/averager the count probability rate is maintained at much less than one to avoid double counting. Therefore DR(1) is about 0.1 for an MCS/averager. For the detector 10 and the transient digitizer the DR(1) is limited by the bit-resolution of the ADC. For an 8-bit digitizer and a single-count intensity of about 2 bits, this would give a value of DR(1) of about 64 for the transient digitizer. In order to distinctly detect counts by detector 10, it is advisable to increase the single-count intensity to e.g. 3 bits giving a value of DR(1) of 32.

Figure 9:
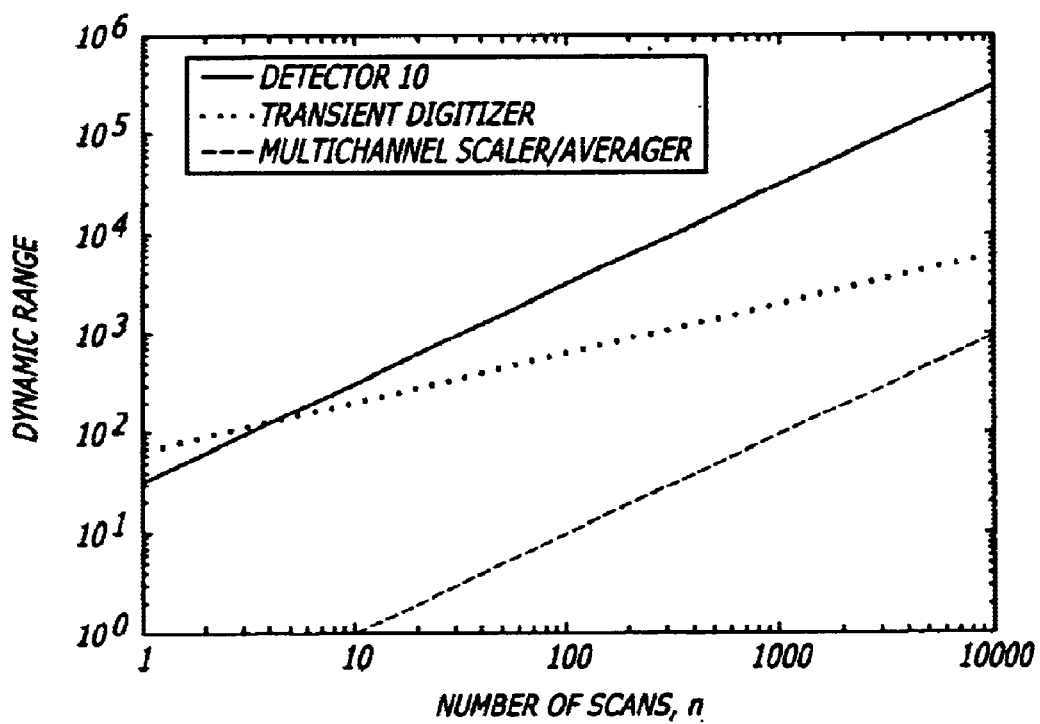
FIG. 9 is a plot showing the dynamic range of the detector compared to the range of prior art detectors.

Based on the equations above advantages of the detector 10 become clear for larger values of n. FIG. 9 plots the DR(n) vs. n. For the transient digitizer, dynamic range increases as $n^{1/2}$. For the HD and MCS/averager dynamic range increases as n. The detector 10 is optimal because it starts with a very high single-scan dynamic range, which then increases rapidly with n.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A time of flight mass spectrometer, comprising:
an accelerator that accelerates an ionized sample;
a detector that provides an analog signal in response to detection of the ionized sample;
an analog to digital converter coupled to said detector; and,
a processor connected to said analog to digital converter, said processor computes a baseline value and a threshold value of the analog signal and assigns the baseline value to the portions of the analog signal at or below the threshold value.

2. The mass spectrometer of claim 1, wherein the baseline value is zero.

3. The mass spectrometer of claim 1, wherein said processor adjust said analog to digital converter to output an intensity value of the analog signal if the analog signal exceeds the threshold value.

4. The mass spectrometer of claim 1, wherein a plurality of analog signals are binned to create a histogram.

5. The mass spectrometer of claim 1, wherein a plurality of analog signals are binned to determine a mean single-pulse intensity that is divided into an amplitude of the analog signal to determine a number of pulses.

6. The mass spectrometer of claim 1, wherein the baseline value is represented by an average value.

7. The mass spectrometer of claim 1, wherein the baseline value is represented by a linear ramp.

8. The mass spectrometer of claim 1, wherein the baseline value is represented by a higher-order polynomial function.

9. The mass spectrometer of claim 1, wherein the baseline value is filtered from the analog signal.

10. The mass spectrometer of claim 1, wherein the analog signal is compressed.

11. A time of flight mass spectrometer, comprising:
accelerator means for accelerating an ionized sample;
detector means for generating an analog signal in response to detection of the ionized sample;
analog to digital means for converting the analog signal to a digital bit string; and,
processor means for computing a threshold value of the analog signal and assigning the baseline value to the portions of the analog signal at or below the threshold value.

12. The mass spectrometer of claim 11, wherein the baseline value is zero.

13. The mass spectrometer of claim 11, wherein said processor means adjust said analog to digital converter means to output an intensity value of the analog signal if the analog signal exceeds the threshold value.

14. The mass spectrometer of claim 11, wherein a plurality of analog signals are binned to create a histogram.

15. The mass spectrometer of claim 11, wherein a plurality of analog signals are binned to determine a mean single-pulse intensity that is divided into an amplitude of the analog signal to determine a number of pulses.

16. The mass spectrometer of claim 11, wherein the baseline value is represented by an average value.

17. The mass spectrometer of claim 11, wherein the baseline value is represented by a linear ramp.

18. The mass spectrometer of claim 11, wherein the baseline value is represented by a higher-order polynomial function.

19. The mass spectrometer of claim 11, wherein the baseline value is filtered from the analog signal.

20. The mass spectrometer of claim 11, wherein the analog signal is compressed.

* * * * *